(12) United States Patent
Hideki

(10) Patent No.: US 7,378,701 B2
(45) Date of Patent: May 27, 2008

(54) PHASE CHANGEABLE MEMORY DEVICES INCLUDING CARBON NANO TUBES

(75) Inventor: Horii Hideki, Seoul (KR)

(73) Assignee: Samsung Electronics Co., Ltd. (KR)

( * ) Notice: Subject to any disclaimer, the term of this patent is extended or adjusted under 35 U.S.C. 154(b) by 404 days.

(21) Appl. No.: 10/827,639

(22) Filed: Apr. 19, 2004

(65) Prior Publication Data

US 2004/0251551 A1    Dec. 16, 2004

(30) Foreign Application Priority Data

Jun. 11, 2003    (KR)    .................. 10-2003-0037678

(51) Int. Cl.
   *H01L 27/108*    (2006.01)
(52) U.S. Cl. ...................... 257/296; 257/302
(58) Field of Classification Search ................ 257/296, 257/302
   See application file for complete search history.

(56) References Cited

U.S. PATENT DOCUMENTS

2004/0166604 A1*    8/2004    Ha et al. .................... 438/102

FOREIGN PATENT DOCUMENTS

KR    10-0393189 B1    7/2002

\* cited by examiner

*Primary Examiner*—Long Pham
(74) *Attorney, Agent, or Firm*—Myers Bigel Sibley & Sajovec, P.A.

(57) ABSTRACT

An integrated circuit phase changeable memory device includes an integrated circuit substrate, a first electrode on the integrated circuit substrate, and a second electrode on the integrated circuit substrate and spaced apart from the first electrode. A carbon nano tube and a phase changeable layer are serially disposed between the first and second electrodes. An insulating layer can include a contact hole and the carbon nano tube may be provided in the contact hole. Moreover, the phase changeable layer also may be provided at least partially in the contact hole. A layer also may be provided at least partially surrounding the carbon nano tube in the contact hole. Related fabrication methods also are provided.

16 Claims, 10 Drawing Sheets

PHASE CHANGEABLE MEMORY DEVICES INCLUDING CARBON NANO TUBES

RELATED APPLICATION

This application claims the benefit of Korean Patent Application No. 2003-0037678, filed Jun. 11, 2003, the disclosure of which is hereby incorporated herein by reference in its entirety as if set forth fully herein.

FIELD OF THE INVENTION

The present invention relates to integrated circuit memory devices and more specifically to phase changeable memory devices and methods for forming the same.

BACKGROUND OF THE INVENTION

Integrated circuit (semiconductor) memory devices can be roughly categorized into volatile memory devices and nonvolatile memory devices according to whether the semiconductor memory devices maintain data when a power supply is cut off. The volatile memory devices may include, for example, DRAM devices and SRAM devices and the nonvolatile memory devices may include, for example, flash memory devices. These conventional memory devices may indicate a logic value "0" or a logic value "1" according to the relative presence or absence of stored charges.

Recently, phase changeable memory devices have been proposed. A phase changeable memory device uses phase changeable materials that change their crystalline states depending on a resistive heating by a current pulse. Conventionally, chalcogenide compounds (GST) including germanium (Ge), antimony (Sb) and/or tellurium (Te) may be used as a phase changeable material.

An amorphous phase changeable material has relatively high electric resistance, and the electric resistance decreases as the amorphous phase changeable material changes gradually into a crystalline state. Since the resistance can vary according to the crystalline states, logic information can be determined by sensing a difference between the resistances. The phase changeable material layer can contact a conductive plug that passes through an insulating layer, and may be provided with heat (Joule heat) from the conductive plug and/or a heater plug. The conductive plug is conventionally formed of conductive nitride materials such as titanium nitride. To embody a phase changeable memory device having low power consumption, the diameter of the conductive plug may be reduced.

However, if the conductive plug is formed of titanium nitride, it may be difficult to reduce the diameter as much as may be desirable. In particular, a heater plug having about 40 nm diameter may not endure a current density of about $10^8$ A/cm$^2$ or more under a write current of about 1 mA, because the titanium nitride may have weak tolerance with respect to this current density. As a result, if a conventional titanium nitride heater plug is used, the diameter of the heater plug may not be reducible under about 40 nm. It therefore may be difficult to provide phase changeable memory devices having a desirably high integration density and/or a desirably low power consumption.

SUMMARY OF THE INVENTION

Some embodiments of the present invention provide integrated circuit phase changeable memory devices that include an integrated circuit substrate, a first electrode on the integrated circuit substrate, and a second electrode on the integrated circuit substrate and spaced apart from the first electrode. A carbon nano tube and a phase changeable layer are serially disposed between the first and second electrodes. The carbon nano tube can have a relatively high tolerance with respect to current density compared to conventional titanium nitride and can thereby enable highly integrated devices that can consume relatively low power, according to some embodiments of the present invention. In some embodiments, the insulating layer also includes a contact hole therein, and the carbon nano tube is in the contact hole. In other embodiments, the phase changeable layer also is at least partially in the contact hole. In still other embodiments, a layer is provided that at least partially surrounds the carbon nano tube in the contact hole.

In other embodiments of the present invention, a phase changeable memory device includes a lower conductive pattern disposed on a substrate and an insulating layer having a contact hole exposing the lower conductive pattern. A carbon nano tube is provided on the exposed surface of the lower conductive pattern in the contact hole. The nano tube is recessed in or flush with the insulating layer. A phase changeable material pattern is disposed on the insulating layer and on the carbon nano tube, remote from the lower conductive pattern. An upper conductive pattern is disposed on the phase changeable material pattern, remote from the carbon nano tube.

In some embodiments of the present invention, the top surface of the carbon nano tube may be recessed in the insulating layer. In some embodiments, the phase changeable material pattern extends into the contact hole. In some embodiments, the phase changeable material pattern fills an upper portion of the contact hole such that a contact region between the carbon nano tube and the phase changeable material pattern is positioned within the contact hole. As a result, a current for a device operation can be reduced, in some embodiments.

In other embodiments of the present invention, a diameter of the carbon nano tube is smaller than a diameter of the contact hole, and a supporting insulating layer is provided in, or fills, a space between the carbon nano tube and the insulating layer that defines the contact hole. The supporting insulating layer may be a porous insulating layer and, in some embodiments, may have relatively good adiabatic property. The porous supporting insulating layer may at least partially surround the nano tube in the contact hole and the phase changeable material pattern in the contact hole. A low-power consumption device may thereby be provided in some embodiments. In some embodiments, the porous supporting insulating layer may comprise spin on glass (SOG). In addition, the porous supporting insulating layer may be formed by spin-coating and thermally treating a silicate base spin on dielectric (SOD) layer.

In some embodiments, the phase changeable material pattern may comprise Te and/or Se, and Ge, Sb, Bi, Pb, Sn, Ag, As, S, Si, P, O and/or N.

In some embodiments of the present invention, the lower conductive pattern comprises cobalt, nickel, iron, chrome, ruthenium, osmium, iridium, platinum, palladium, silver, gold, titanium, zirconium, niobium, tantalum, tungsten, molybdenum, tungsten silicide, cobalt silicide, nickel silicide and/or titanium tungsten.

In some embodiments of the present invention, the upper conductive pattern comprises titanium nitride, tantalum nitride, molybdenum nitride, niobium nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, titanium oxide nitride, titanium aluminum oxide nitride, tungsten oxide nitride, tantalum oxide nitride, titanium, tantalum, titanium aluminum, zirconium, hafnium, molybdenum, tungsten, copper, aluminum, aluminum-copper alloy, aluminum-copper-silicon alloy, titanium tungsten and/or tungsten silicide.

In some embodiments of the present invention, a method for forming a phase changeable memory device includes the following. A lower conductive pattern is formed on a substrate. An insulating layer having a contact hole is formed on the substrate. The contact hole exposes the lower conductive pattern. A carbon nano tube is formed on the lower conductive pattern exposed by the contact hole and is flush with or recessed in the insulating layer. A phase changeable material pattern and an upper conductive pattern are formed on the nano tube and on the insulating layer outside the nano tube.

In some embodiments of the present invention, the forming of the carbon nano tube flush with or recessed in the insulating layer, includes growing the carbon nano tube on the lower conductive pattern to be recessed in the insulating layer. In these embodiments, the phase changeable material pattern can extend into the contact hole. In some of these embodiments, insulating spacers may be further formed on sidewalls of the contact hole.

In some embodiments of the present invention, the forming of the carbon nano tube flush with or recessed in the insulating layer on the lower conductive pattern exposed by the contact hole, comprises growing a carbon nano tube on the lower conductive pattern to protrude beyond the insulating layer, forming a supporting insulating layer on the insulating layer to cover a carbon nano tube that protrudes from the insulating layer, and planarizing the supporting insulating layer and the carbon nano tube until the insulating layer is exposed. In some embodiments, after the planarization process, a selective etch back process is further performed to the carbon nano tube to be recessed in the insulating layer. In these embodiments, the phase changeable material pattern can extend into the contact hole.

In some embodiments of the present invention, the carbon nano tube is grown to be smaller than the contact hole in diameter, and the supporting insulating layer is provided inside of the residual contact hole to at least partially surround the outer sidewall of the carbon nano tube. The supporting insulating layer may comprise a porous insulating layer. For example, the supporting layer may be formed by depositing an SOG layer and performing heat treatment. The supporting layer may be formed by spin coating a silicate based spin on dielectric (SOD) and thermally treating the SOD layer.

In some embodiments, the forming the carbon nano tube to be flush with or recessed in the insulating layer includes growing a carbon nano tube on the lower conductive pattern to be flush with or recessed in the insulating layer and to have a diameter smaller than a diameter of the contact hole, forming a supporting insulating layer on the insulating layer to at least partially surround the outer sidewall of the carbon nano tube by, in some embodiments, filling the contact hole, and selectively etching back the supporting insulating layer to expose the carbon nano tube. The supporting insulating layer may comprise a porous insulating layer. The porous insulating layer may be formed by depositing an SOG layer and treating the SOG layer thermally. In other embodiments, the porous insulating layer may be formed by spin coating an SOD layer and treating the SOD layer thermally.

In some embodiments, the carbon nano tube may be formed using a thermal chemical vapor deposition technique, a plasma chemical vapor deposition technique, an electron cyclotron resonance (ECR) chemical vapor deposition technique, an electric discharge technique, a laser deposition technique, and/or other conventional techniques.

In some embodiments, the lower conductive pattern may comprise cobalt, nickel, iron, chrome, ruthenium, osmium, iridium, palladium, silver, gold, titanium, zirconium, niobium, tantalum, tungsten, molybdenum, tungsten silicide, cobalt silicide, nickel silicide and/or titanium tungsten.

In some embodiments, the phase changeable material pattern may comprise Te and/or Se and Ge, Sb, Bi, Pb, Sn, Ag, As, S, Si, P, O and/or N.

In some embodiments, the upper conductive pattern may comprise titanium nitride, tantalum nitride, molybdenum nitride, niobium nitride, titanium silicon nitride, titanium aluminum nitride, titanium boron nitride, zirconium silicon nitride, tungsten silicon nitride, tungsten boron nitride, zirconium aluminum nitride, molybdenum silicon nitride, molybdenum aluminum nitride, tantalum silicon nitride, tantalum aluminum nitride, titanium oxide nitride, titanium aluminum oxide nitride, tungsten oxide nitride, tantalum oxide nitride, titanium, tantalum, titanium aluminum, zirconium, hafnium, molybdenum, tungsten, copper, aluminum, aluminum-copper alloy, aluminum-copper-silicon alloy, titanium tungsten and/or tungsten silicide.

DETAILED DESCRIPTION

Figure 1:
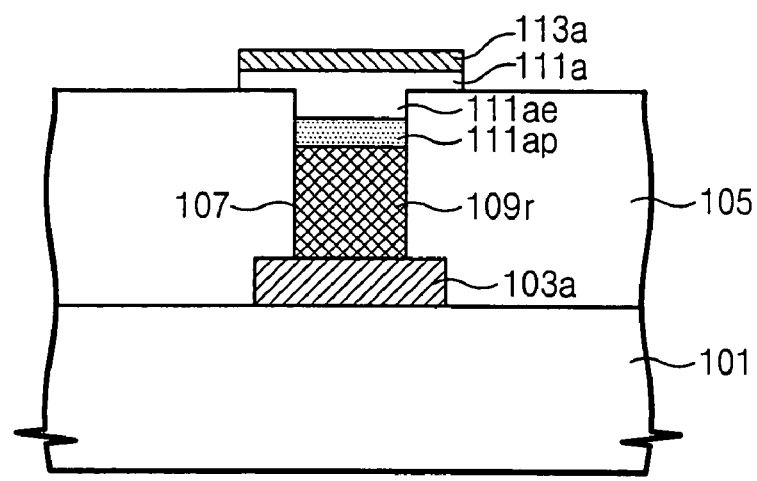
FIG. 1 is a cross-sectional view illustrating a phase-changeable memory device according to some embodiments of the present invention.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "lower" or "upper" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various embodiments, elements, components, regions, layers and/or sections, these embodiments, elements, components, regions, layers and/or sections should not be limited by these terms. These terms are only used to distinguish one embodiment, element, component, region, layer or section from another region, layer or section. Thus, a first embodiment, region, layer or section discussed below could be termed a second embodiment, region, layer or section, and, similarly, a second embodiment, region, layer or section could be termed a first embodiment, region, layer or section without departing from the teachings of the present invention.

In addition, a liner layer or a formation of a liner layer means a layer that is formed to have relatively uniform thickness along at least part of an outline of a lower structure or a formation of the same. Conformal formation of any material layer has the same meaning.

FIG. 1 is a schematic cross-sectional view illustrating a phase changeable memory device according to embodiments of the present invention. Referring to FIG. 1, a lower conductive pattern 103a is formed on an integrated circuit (semiconductor) substrate 101. An insulating layer 105 is formed on the substrate 101 to surround the lower conductive pattern 103a. A contact hole 107 is defined in the insulating layer 105 to expose the lower conductive pattern 103a. The insulating layer 105 may comprise, for example, silicon oxide.

A carbon nano tube 109r is provided in the contact hole 107 and, in some embodiments, fills a portion of the contact hole. The carbon nano tube 109r contacts the lower conductive pattern 103a and the carbon nano tube 109r is recessed in insulating layer 105.

A phase changeable material pattern 111a is disposed on the insulating layer 105 and, in some embodiments, fills a remaining portion of the contact hole 107, that is, an upper portion of the contact hole 107. An upper conductive pattern 113a is disposed on the phase changeable material pattern 111a. In FIG. 1, since the carbon nano tube 109r fills a portion of the contact hole 107, the phase changeable material pattern 111a has an extension part 111ae that extends in the contact hole 107. As a result, a contact region between the phase changeable material pattern 111a and the carbon nano tube 109r is located in the contact hole 107. Accordingly, for example, if a current path is formed between the lower conductive pattern 103a and the upper conductive pattern 113a to provide a current for the phase changeable material pattern 111a through the carbon nano tube 109r during a program operation, the current can be densely concentrated in the extension part of the phase changeable material pattern 111ae in the contact hole 107. Therefore, in some embodiments, a volume of a program region can be reduced, which can reduce the current for phase change because the portion of the phase changeable material pattern 111a in which crystalline structure varies (i.e., the program region) 111ap is formed at the extension part 111ae within the contact hole 107.

Embodiments of FIG. 1 also may be regarded as providing an integrated circuit phase changeable memory device that includes an integrated circuit substrate 101, a first electrode 103a on the integrated circuit substrate, a second electrode 113a on the integrated circuit substrate and spaced apart from the first electrode 103a, and a carbon nano tube 109r and a phase changeable layer 111a serially disposed between the first and second electrodes 103a, 113a, respectively. FIGS. 2-20 also illustrate other embodiments of these integrated circuit phase changeable memory devices.

The lower conductive pattern 103a may comprise a metallic material capable of serving as a catalyzer for growing the carbon nano tube. For instance, the lower conductive pattern 103a may include cobalt (Co), nickel (Ni), iron (Fe), chrome (Cr), ruthenium (Ru), osmium (Os), iridium (Ir), platinum (Pt), palladium (Pd), silver (Ag), gold (Au), titanium (Ti), zirconium (Zr), niobium (Nb), tantalum (Ta), tungsten (Tw), molybdenum (Mo), tungsten silicide (WSi), cobalt silicide (CoSi), nickel silicide (NiSi) and/or titanium tungsten (TiW).

The phase changeable material pattern 111a may comprise tellurium (Te) and/or selenium (Se), and Ge, Sb, Bi, Pb, Sn, Ag, As, S, Si, P, O and/or N.

The upper conductive pattern may comprise titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxide nitride (TiON), titanium aluminum oxide nitride (TiAlON), tungsten oxide nitride (WON), tantalum oxide nitride (TaON), titanium (Ti), tantalum (Ta), titanium aluminum (TiAl), zirconium (Zr), hafnium (Hf), molybdenum (Mo), tungsten (W), copper (Cu), aluminum (Al), aluminum-copper (Al—Cu), aluminum-copper-silicon (Al—Cu—Si), titanium tungsten (TiW) and/or tungsten silicide (WSi).

The carbon nano tube can have relatively high tolerance with respect to a current density compared to titanium nitride, such that the carbon nano tube having a diameter of about 10 nm or less may endure a current density of about $10^9$ A/cm$^2$ under a current of about 1 mA. Therefore, devices according to some embodiments of the invention can be embodied to have characteristics of high-integration density and/or low power consumption.

Figure 2:
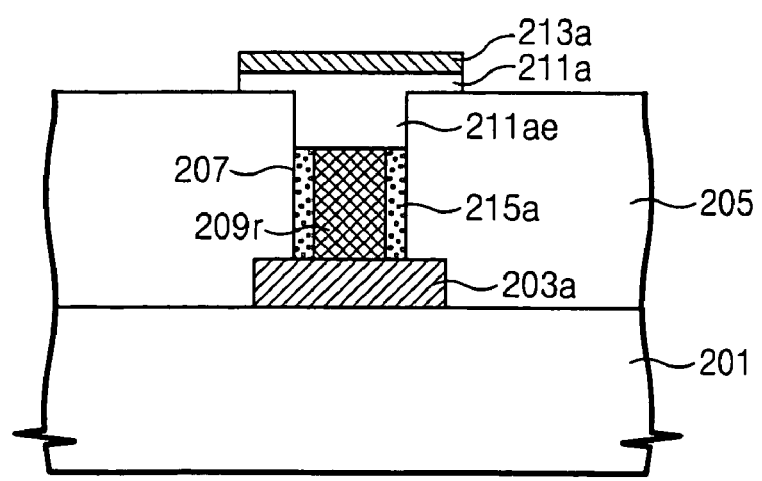
FIG. 2 is a cross-sectional view illustrating a phase-changeable memory device according to other embodiments of the present invention.

FIG. 2 is a schematic cross-sectional view illustrating a phase-changeable memory device according to other embodiments of the present invention. Referring to FIG. 2, the 200 series of elements according to these embodiments is similar to the 100 series of elements of the device according to FIG. 1, except for the following two respects. One is that the device of FIG. 2 has a carbon nano tube 209r, the diameter of which is smaller than a diameter of the contact hole 207. The other is that a supporting insulating layer 215a is interposed between the carbon nano tube 209r and sidewalls of the insulating layer 205 that defines the contact hole 207. Thus, the above description will not be repeated in further detail.

The supporting insulating layer 215a at least partially surrounds the carbon nano tube 209r in the contact hole 207, and can physically protect and can block heat dissipation as will be explained herein. The supporting insulating layer 215a supports the carbon nano tube 209r physically, such that the carbon nano tube 209r may be formed to have a diameter as small as desirable.

In this embodiment, a contact region between the phase changeable pattern 211a and the carbon nano tube 209r can be smaller than embodiments of FIG. 1.

The supporting insulating layer 215a may insulate heat effectively. For example, the supporting insulating layer 215a may comprise a porous insulating layer. One example of a porous insulating layer is a SOG layer. Alternatively, the porous insulating layer may be formed by a spin-coating and a thermal treating of silicate base spin on dielectric (SOD).

The supporting insulating layer 215a may physically support and may also reduce or prevent the carbon nano tube 209r from loosing heat. Therefore, the current in a device operation may be reduced, in some embodiments.

Figure 3:
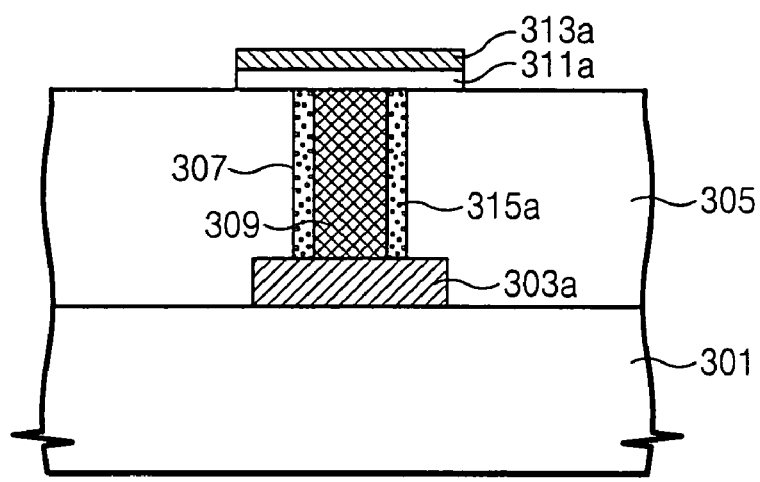
FIG. 3 is a cross-sectional view illustrating a phase changeable memory device according to still other embodiments of the present invention.

FIG. 3 is a schematic cross-sectional view illustrating a phase-changeable memory device according to still other embodiments. Referring to FIG. 3, the 300 series of elements of FIG. 3 has the same structure as the 200 series of elements of FIG. 2 except that a carbon nano tube is as tall as (flush with) the contact hole 307 and the insulating layer 305. Moreover, in some embodiments, a diameter of the carbon nano tube 309 is smaller than that of the contact hole 307, such that a supporting insulating layer 312a is in, and, in some embodiments, fills, a contact region between sidewalls of the insulating layer that defines the contact hole 307 and the carbon nano tube 309. In these embodiments, the contact region between the phase changeable pattern and the carbon nano tube can decrease compared to devices according to the FIG. 1. In addition, the supporting insulating layer 315a can comprise a porous insulating layer that can have a good adiabatic property. Therefore, the supporting insulating layer 315a can allow devices to have a relatively low power consumption.

A phase changeable material pattern 311a is provided on the insulating layer 305, on the carbon nano tube 309 and on the supporting insulating layer 307, and an upper conductive pattern 313a is provided on the phase changeable material pattern 311a remote from the carbon nano tube 309.

It will be understood by those skilled in the art that insulating spacers (not shown in the drawings) may be further formed on the sidewalls of the contact hole in case of the devices explained above. In other embodiments, a layer at least partially surrounding the carbon nano tube in the contact hole may be embodied by the supporting insulating layer and/or a spacer.

Methods for fabricating the devices explained above will be described herein. For brevity, explanations for identical fabrication steps will not be further repeated.

Figure 4:
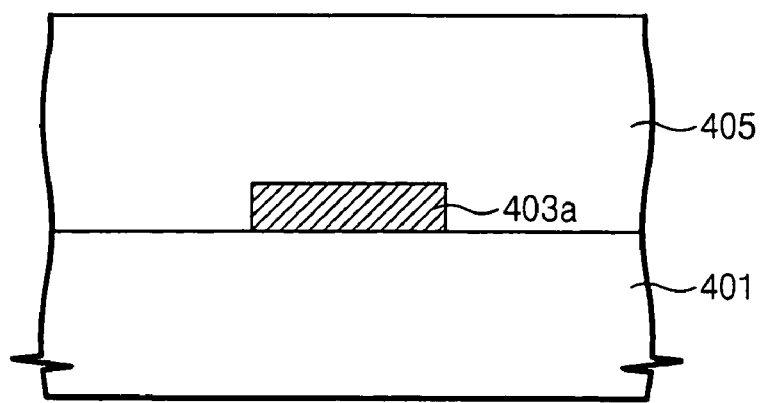
FIGS. 4 through 7 are cross-sectional views illustrating methods for forming a phase changeable memory device of FIG. 1 in the order of a fabricating process, according to embodiments of the present invention.

FIGS. 4 through 7 are cross-sectional views illustrating methods for fabricating a device of FIG. 1 in the order of principal fabricating steps. Referring to FIG. 4, a substrate 401 is prepared. The substrate 401 can be a semiconductor substrate formed of silicon, silicon-germanium, etc. A lower conductive pattern 403a is formed on the substrate 401. Not illustrated in the drawings, a device isolation process may be performed using a conventional fabricating process before forming the lower conductive pattern 403, and a transistor including a gate, a source and a drain may be formed. The lower conductive pattern 403a may be electrically connected to a source of the transistor, for example. In addition, when the lower conductive pattern 403a is formed, a lower metal interconnection may be formed to electrically connect the drain of the transistor at the same time.

The lower conductive pattern 403a may comprise a metallic material serving as a catalyzer for growing the carbon nano tube. For instance, the lower conductive pattern 403a may comprise cobalt, nickel, iron, chrome, ruthenium, osmium, iridium, platinum, palladium, silver, gold, titanium, zirconium, niobium, tantalum, tungsten, molybdenum, tungsten silicide, cobalt silicide, nickel silicide and/or titanium tungsten.

Still referring to FIG. 4, an insulating layer 405 is formed on the substrate 401 to cover the lower conductive pattern 403a. The insulating layer 405 may comprise silicon oxide formed by a chemical vapor deposition technique.

Figure 5:
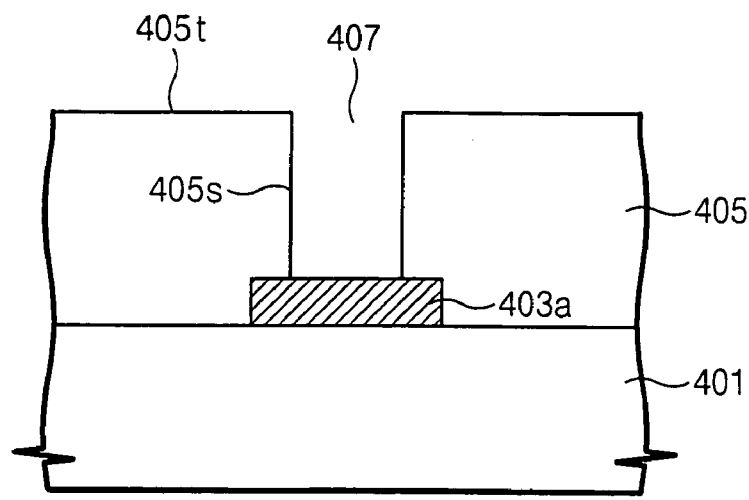

Referring to FIG. 5, the insulating layer 405 is patterned to form a contact hole 407 exposing the lower conductive pattern 403a. The contact hole 407 is defined by sidewalls 405s of the etched insulating layer 405 and exposed top surface of the lower conductive pattern 403a.

Figure 6:
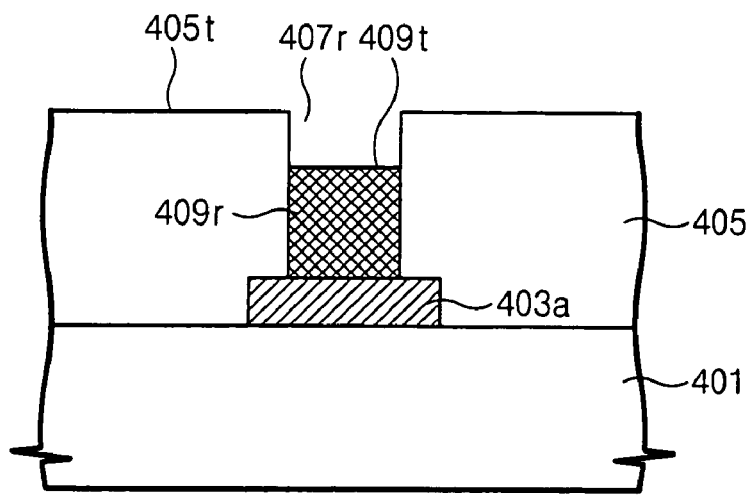

Referring to FIG. 6, a carbon nano tube 409r is grown up from a surface of the lower conductive pattern 403a exposed by the contact hole 407. By controlling process time, a growing height of the carbon nano tube 409r can be determined. The carbon nano tube 409r may be formed by a thermal chemical vapor deposition technique, a plasma chemical vapor deposition technique, an electron cyclotron resonance (ECR) chemical vapor deposition technique, an electric discharge technique, a laser deposition technique and/or other conventional technique.

For example, in case of the chemical vapor deposition technique, a carbon source may include $C_2H_4$, $CH_4$, CO, $CO_2$ an alcohol such as methanol and/or carbon halogenide such as $C_4F_6$. In addition, a reaction gas may include nitrogen, ammonia and/or hydrogen and a carrier gas may include inert gas such as argon, helium, neon, etc.

In these embodiments, the carbon nano tube 409r grows to the height at which the upper surface 409t of the carbon nano tube 409r is lower than the height of the insulating layer 405. In other words, the carbon nano tube 409r is recessed in the insulating layer 405. This can be achieved by controlling a process time. Therefore, the carbon nano tube 409r may fill a portion of the contact hole 407.

In some embodiments, insulating spacers may be further formed on sidewalls or the contact hole 407 before the carbon nano tube 409r is formed.

Figure 7:
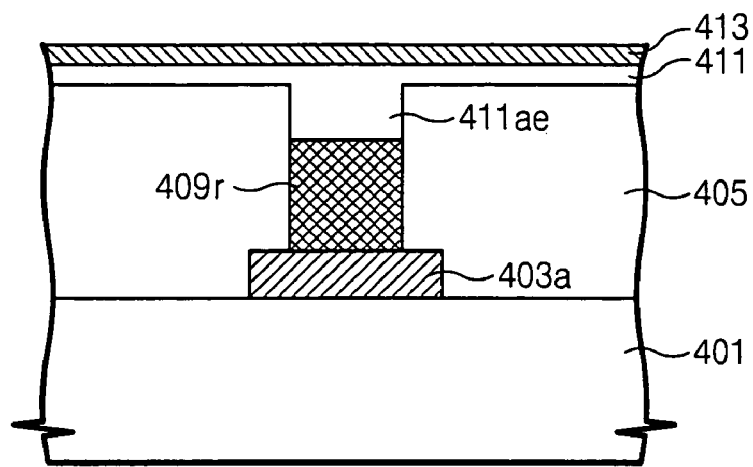

Referring to FIG. 7, a phase changeable material layer 411 and an upper conductive layer 413 are sequentially formed in a residual contact hole 407r (FIG. 6) and on the insulating layer 405. In this case, the phase changeable material layer 411 may include an extension part 411 ae that extends in the contact hole 407.

The phase changeable material layer 411 may comprise materials, the crystalline structure of which vary depending on a temperature (or heat). For example, the phase changeable material layer 411 may comprise Te and/or Se, and Ge, Sb, Bi, Pb, Sn, Ag, As, S, Si, P, O and/or N.

As one example, Ge—Sb—Te may be formed using a sputtering technique. A process targeting Ge—Sb—Te is performed under a condition of about 10 nm argon and about 500 W DC power.

The upper conductive layer 413 may comprise titanium nitride (TiN), tantalum nitride (TaN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium oxide nitride (TiON), titanium aluminum oxide nitride (TiAlON), tungsten oxide nitride (WON), tantalum oxide nitride (TaON), titanium (Ti), tantalum (Ta), titanium aluminum (TiAl), zirconium (Zr), hafnium (Hf), molybdenum (Mo), tungsten (W), copper (Cu), aluminum (Al), aluminum-copper (Al—Cu), aluminum-copper-silicon (Al—Cu—Si), titanium tungsten (TiW) and/or tungsten silicide (WSi).

Next, the upper conductive layer 413 and the phase changeable material layer 411 are patterned to form an upper conductive pattern 413a and a phase changeable material pattern 411a as illustrated in FIG. 1.

As a subsequent process, an upper metal interconnection may be formed to connect the upper conductive pattern 413a electrically.

According to other embodiments, insulating spacers may be further formed on sidewalls of a residual contact hole 407r to reduce a diameter thereof before forming the phase changeable material layer 411.

Other methods for forming the phase changeable memory device of FIG. 1 will be described referring to FIGS. 8 through 11. First, referring to FIG. 8, a lower conductive pattern 803a and an insulating layer 805 including a contact hole 807 are formed on a substrate 801 in the same method as was explained above.

Figure 8:
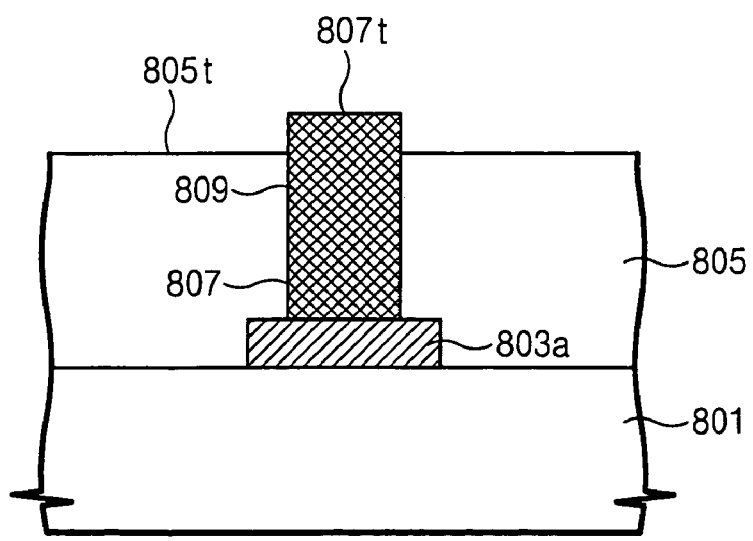
FIGS. 8 through 11 are cross-sectional views illustrating methods for forming a phase changeable memory device of FIG. 1 in the order of a fabricating process according to other embodiments of the present invention.

Still referring to FIG. 8, a carbon nano tube 809 is grown up on a surface of the lower conductive pattern 803a exposed by the contact hole 807. In these embodiments, the carbon nano tube 809 fills the contact hole 807 entirely and protrudes beyond a top surface 805t of the insulating layer 805.

Figure 9:
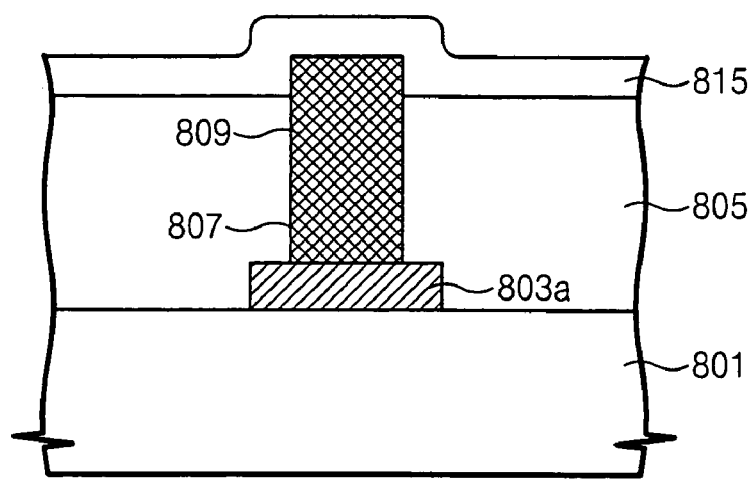

Referring to FIG. 9, a supporting insulating layer 815 is formed on the insulating layer 805 and the protruding carbon nano tube 809. The supporting insulating layer 815 may comprise, for example, silicon oxide formed by a chemical vapor deposition technique. In addition, a porous insulating layer may be used instead of the silicon oxide because of its potentially excellent adiabatic property.

Figure 10:
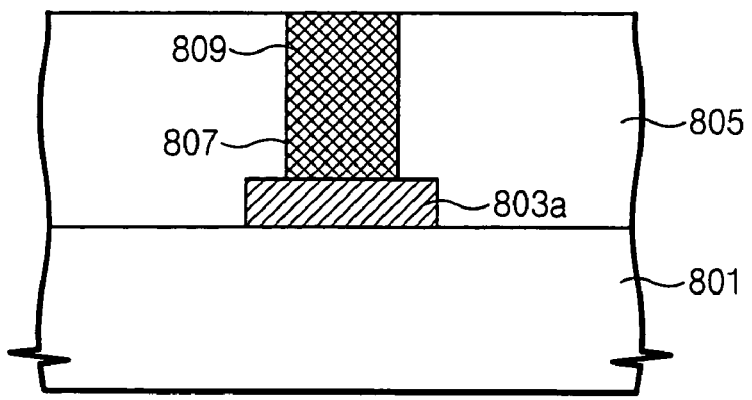

Referring to FIG. 10, the supporting insulating layer 815 and the protruding carbon nano tube 809 are planarizingly etched until a top surface of the insulting layer 805 is exposed. Therefore, the carbon nano tube 809 may remain flush with the insulation layer 805 in the contact hole 807. The planarization process is stopped when the top surface of the insulting layer 805 is exposed by controlling a time to perform the planarization process.

Alternatively, a planarizing etch stop layer may be used. That is, a planarizing etch stop layer may be formed on the insulating layer 805 to stop the planarizing etch. Briefly, the insulating layer 805 is formed on the substrate 801 and the lower conductive pattern 803a, and then the planarizing etch stop layer is formed thereon. The etch stop layer and the insulating layer are patterned to form the contact hole 807 and a carbon nano tube is grown. Then, a supporting insulating layer is formed on the etch stop layer and the protruding carbon nano tube and planarized using the planarizing etch stop layer as a planarizing etch stop layer.

Figure 11:
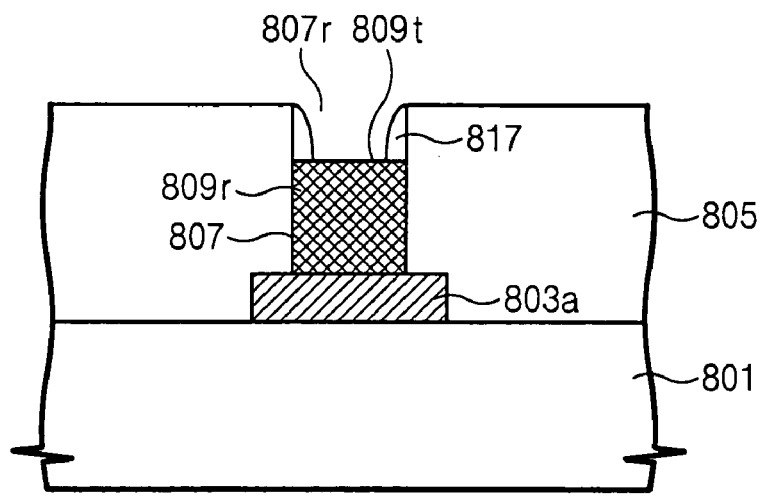

Referring to FIG. 11, a selective etch back process is applied to the carbon nano tube to recess the top surface 809t of the carbon nano tube in the insulating layer 805. Therefore, a recessed part 807r is defined to expose the top surface of the carbon nano tube 809r. The part 807r corresponds to the residual contact hole 407r illustrated in FIG. 6. Additionally, sidewall spacers 817 may be further formed on sidewalls of the recessed part 807r. As a result, a contact region between the phase changeable material pattern and the carbon nano tube can further decrease. These insulating spacers 817 may comprise material having etch selectivity with respect to the insulating layer 405. For instance, the insulating spacers 817 may comprise silicon nitride.

In the above embodiment, if the supporting insulating layer is formed to have a planar top surface in FIG. 9, the planarization process can be performed to expose a top surface of the carbon nano tube. Then, the exposed carbon nano tube is selectively etched back. In this case, the supporting insulating layer 815 may be formed of porous insulating material.

Then, the phase changeable material layer and the upper conductive layer are deposited and patterned using the same method as what is explained above.

Figure 12:
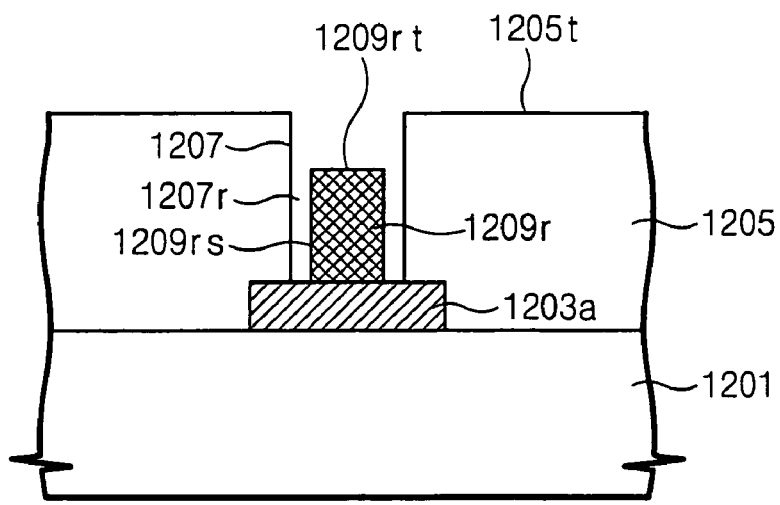
FIGS. 12 through 15 are cross-sectional views illustrating methods for fabricating a phase changeable memory device of FIG. 2 in the order of a fabricating process according to embodiments of the present invention.

Now, referring to FIGS. 12 through 15, methods for forming a phase changeable memory device of FIG. 2 will be explained. Referring to FIG. 12, a lower conductive pattern 1203a is formed on a substrate 1201 in the same manner as what is explained above, and an insulating layer 1205 including a contact hole 1207 is formed.

Referring to FIG. 12 again, a carbon nano tube 1209r is grown from a surface of the lower conductive pattern 1203a exposed by the contact hole 1207. In this case, a diameter of the carbon nano tube 1209r is formed to be smaller than that of the contact hole 1207 and a height of the carbon nano tube 1209r is lower than that of the insulating layer 1205 by controlling a process condition. That is, the carbon nano tube can be grown until a top surface 1209rt thereof is lower than a top surface 1205t of the insulating layer, so that the nano tube 1209r is recessed in the insulating layer 1205.

In some embodiments, insulating spacers may be further formed on sidewalls of the contact hole 1207 before a growth of the carbon nano tube 1209r.

Figure 13:
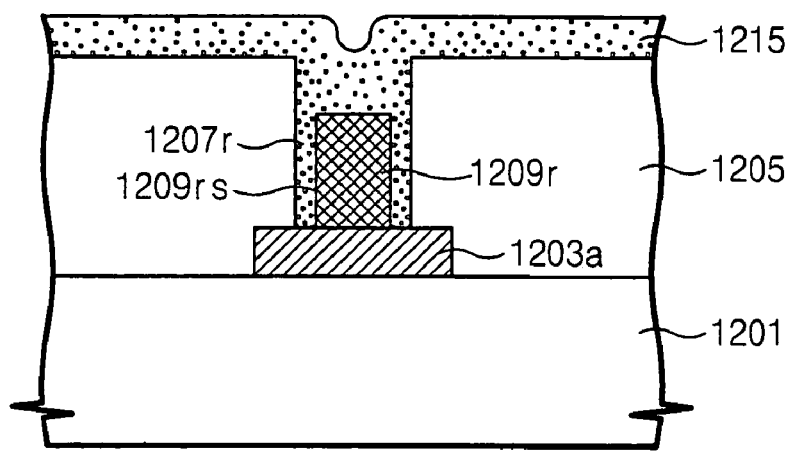

Referring to FIG. 13, a supporting insulating layer 1215 is formed on the insulating layer 1203 to at least partially surround an outer surface 1209rs of the carbon nano tube 1209r by, in some embodiments, filling the residual contact hole 1207r entirely. The supporting insulating layer 1215 may comprise an insulating layer having good step coverage, and, in some embodiments, a porous insulating layer having good adiabatic property. For example, an SOG layer is deposited and then thermally treated to form the supporting insulating layer 1215. This insulating layer having a good adiabatic property at least partially surrounds the carbon nano tube, such that a current for operations of a device can be reduced.

Figure 14:
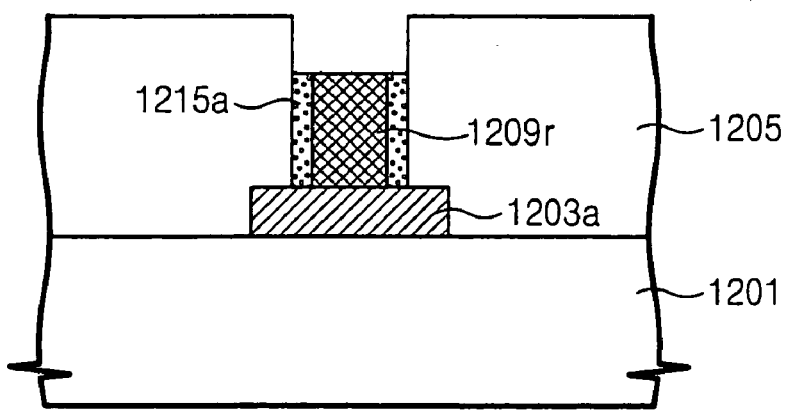

Referring to FIG. 14, the supporting insulating layer 1215 is removed until the top surface of the carbon nano tube 1209r is exposed. In this case, there may be two methods for removing the supporting insulating layer 1215. One is to sequentially perform a planarization process and an etch back process and the other is to perform only the etch back process. In the former case, the planarization process may be performed until the insulating layer 1205 is exposed, and the etch back process may be performed until the carbon nano tube 1209r is exposed. In the latter case, the insulating layer is selectively etched back until the carbon nano tube is exposed. Other methods may be used.

Figure 15:
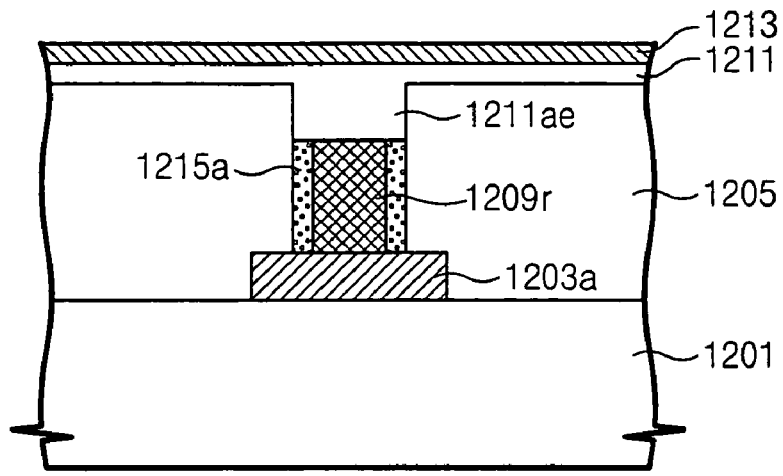

Referring to FIG. 15, a phase changeable material layer 1211 and an upper conductive layer 1213 are formed sequentially and patterned.

In these embodiments, the carbon nano tube can be formed smaller than the contact hole in diameter, such that a contact area between the phase changeable material pattern and the carbon nano tube may be reduced. As a result, power dissipation for device operations can be reduced. In addition, the supporting insulating layer surrounds the carbon nano tube to support and to prevent the heat from conducting outside the nano tube. The phase changeable material layer can extend into the contact hole to define a program area within the contact hole, such that the power dissipation for a program operation can be reduced.

Figure 16:
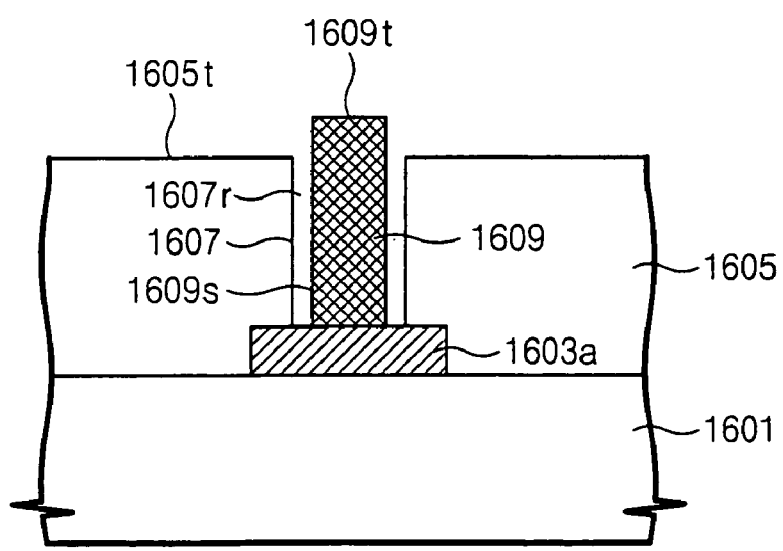
FIGS. 16 through 19 are cross-sectional views illustrating methods for fabricating a phase changeable memory device of FIG. 3 in the order of a fabricating process according to embodiments of the present invention.

Referring to FIGS. 16 through 19, methods for forming a phase changeable memory device of FIG. 3 will be explained. Referring to FIG. 16, first, a lower conductive pattern 1603a is formed on a substrate 1601 and an insulating layer 1605 including a contact hole 1607 is formed in the same manner as explained above.

Still referring to FIG. 16, a carbon nano tube 1609 is grown up vertically from a surface of the lower conductive pattern 1603a exposed by the contact hole 1607. In this case, process conditions are controlled to shorten a diameter of the carbon nano tube 1609 compared to that of the contact hole 1607, and to make the carbon nano tube higher than a height of the insulating layer 1205. That is, the carbon nano tube 1609 is grown until a top surface 1609t thereof is higher than a top surface 1605t of the insulating layer, so that it protrudes form the insulating layer.

Figure 17:
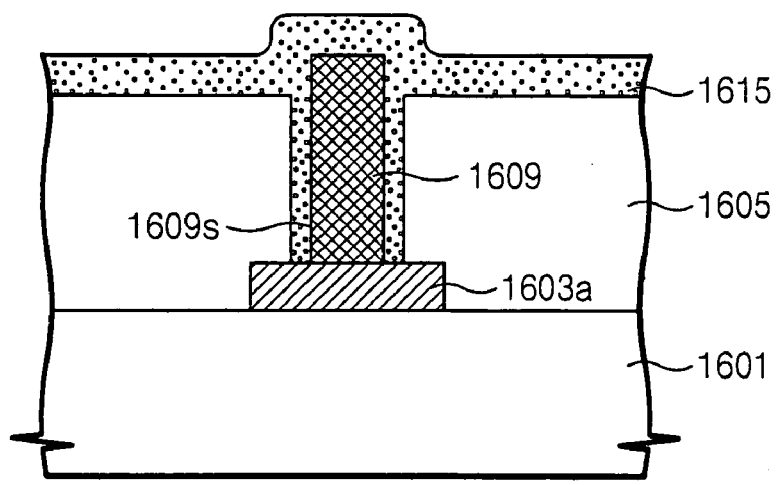

Referring to FIG. 17, a supporting insulating layer 1615 is formed on the insulating layer 1603 to at least partially surround an outer surface 1609s of the carbon nano tube 1609 by, in some embodiments, filling the residual contact hole 1607r entirely. The supporting insulating layer 1615 may comprise an insulating layer having good step coverage and, in some embodiments, a porous insulating layer having good adiabatic property. For example, an SOG layer is deposited and treated thermally to form the supporting insulating layer. The insulating layer having good adiabatic property at least partially surrounds the carbon nano tube, such that the carbon nano tube can be effectively insulated from losing substantial heat during an operation of device.

Figure 18:
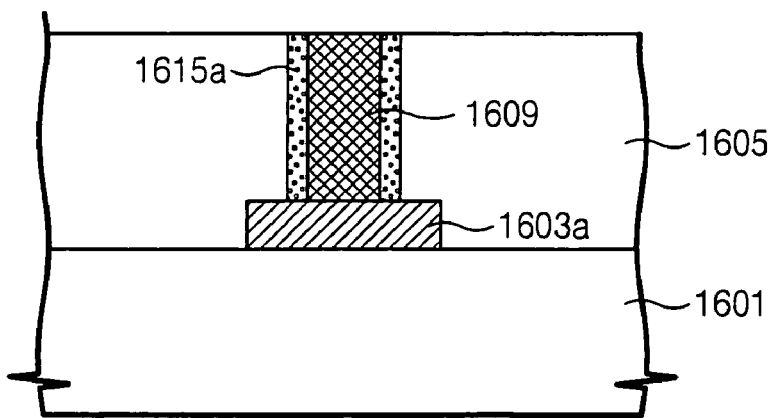

Referring to FIG. 18, a planarization process is performed to expose the insulating layer 1605. Therefore, the insulating layer 1615a and the carbon nano tube 1609 remain flush with the contact hole 1607.

Figure 19:
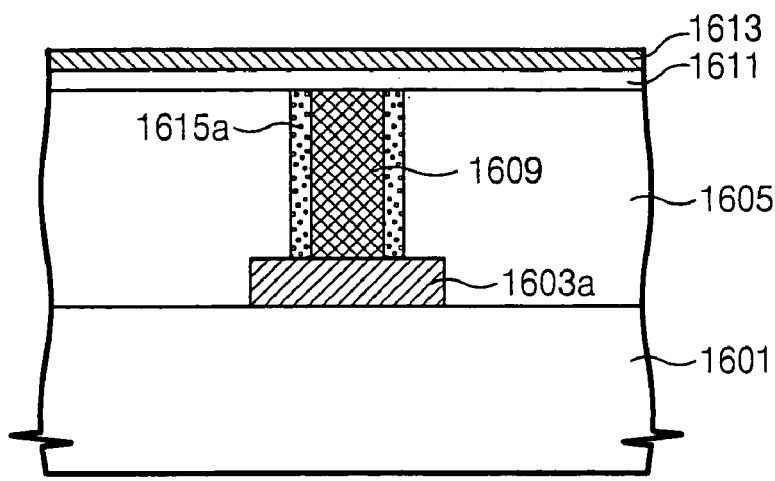

Referring to FIG. 19, a phase changeable material layer 1611 and the upper conductive layer 1613 are sequentially stacked on the insulating layer 1605, the carbon nano tube 1609 and the supporting insulating layer 1605.

In a subsequent process, a photolithographic etching process is performed to form an upper conductive pattern 1613a and a phase changeable material pattern 1611a as illustrated in FIG. 3.

Figure 20:
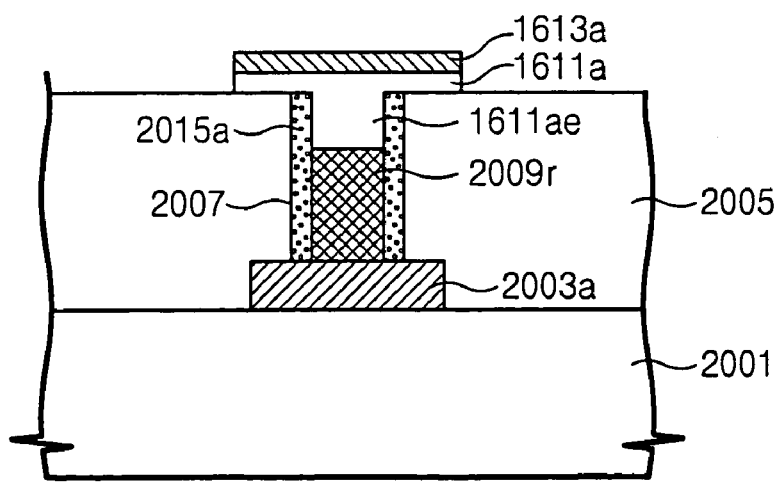
FIG. 20 is a cross-sectional view illustrating a phase changeable memory device according to still other embodiments of the present invention.

As shown in FIG. 20, the carbon nano tube 2009r is selectively etched back to lower a top surface thereof compared to a top surface of the insulating layer 2005 before the formation of the phase-changeable material layer 1611.

More particularly, if the top surface of the supporting insulating layer 2015a is formed to be plane, the planarization process may be performed until the top surface of the carbon nano tube is exposed. In addition, the planarization process is performed to expose the carbon nano tube and then the exposed carbon nano tube may be selectively etched back. Other 2000 series elements of FIG. 20 are similar to the 1600 series described above.

In embodiments of FIG. 20, a diameter of the carbon nano tube may be reduced compared to the contact hole, such that the contact region between the phase changeable material pattern and the carbon nano tube can be reduced. As a result, power dissipation for an operation of device can be decreased. In addition, the supporting insulating layer surrounds the carbon nano tube to support and/or to achieve a good adiabatic effect.

According to some embodiments of the present invention, a carbon nano tube having good tolerance with respect to current density is used for supplying current to a phase changeable material layer. The carbon nano tube can be formed to have a very small diameter. Therefore, a carbon nano tube according to some embodiments of the present invention can allow highly integrated devices.

Moreover, because a height of the carbon nano tube can be controlled to extend a phase changeable material pattern into the contact hole, a program region can be reduced to decrease a power dissipation.

An outer sidewall of the carbon nano tube can be surrounded by a porous insulating layer having good adiabatic property in some embodiments, such that heat conductive efficiency of the carbon nano tube can be improved to reduce the power dissipation accordingly.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. An integrated circuit phase changeable memory device comprising:
    an integrated circuit substrate;
    a first electrode on the integrated circuit substrate;
    a second electrode on the integrated circuit substrate and spaced apart from the first electrode; and
    a carbon nano tube and a phase changeable layer serially disposed between the first and second electrodes.

2. The device of claim 1 further comprising an insulating layer including a contact hole therein, wherein the carbon nano tube is in the contact hole.

3. The device of claim 2 wherein the phase changeable layer also is at least partially in the contact hole.

4. The device of claim 2 further comprising a layer at least partially surrounding the carbon nano tube in the contact hole.

5. An integrated circuit phase changeable memory device, comprising:
    a lower conductive pattern disposed on an integrated circuit substrate;
    an insulating layer disposed on the substrate and having a contact hole exposing a surface of the lower conductive pattern;
    a carbon nano tube on the exposed surface of the lower conductive pattern in the contact hole;
    a phase changeable material pattern disposed on the carbon nano tube and on the insulating layer remote from the lower conductive pattern; and
    an upper conductive pattern disposed on the phase changeable material pattern remote from the carbon nano tube.

6. The device of claim 5, wherein a diameter of the carbon nano tube is smaller than a diameter of the contact hole, wherein a supporting insulating layer is interposed between the carbon nano tube and sidewalls of the insulating layer that defines the contact hole.

7. The device of claim 6, wherein the phase changeable material pattern comprises Te and/or Se, and Ge, Sb, Bi, Pb, Sn, Ag, As, S, Si, P, O and/or N.

8. The device of claim 6, wherein the supporting insulating layer comprises a porous insulating layer.

9. The device of claim 5, wherein the lower conductive pattern comprises cobalt, nickel, iron, chrome, ruthenium, osmium, iridium, platinum, palladium, silver, gold, titanium, zirconium, niobium, tantalum, tungsten, molybdenum, tungsten silicide, cobalt silicide, nickel silicide and/or titanium tungsten.

10. The device of claim 5, wherein the carbon nano tube is recessed in the insulating layer, and
    wherein the phase changeable material pattern extends in the contact hole and on the insulating layer outside the contact hole.

11. The device of claim 10, wherein a diameter of the carbon nano tube is smaller than a diameter of the contact hole, and wherein a supporting insulating layer is interposed between sidewalls of the insulating layer that define the contact hole and the carbon nano tube and between the phase changeable material pattern extending into the contact hole and the sidewalls of the insulating layer.

12. The device of claim 11, wherein the supporting insulating layer comprises a porous insulating layer.

13. The device of claim 10, further comprising insulating spacers between the phase changeable material pattern extending into the contact hole and sidewalls of the insulating layer that define the contact hole.

14. The device of claim 11, wherein the lower conductive pattern comprises cobalt, nickel, iron, chrome, ruthenium, osmium, iridium, platinum, palladium, silver, gold, titanium, zirconium, niobium, tantalum, tungsten, molybdenum, tungsten silicide, cobalt silicide, nickel silcide and/or titanium tungsten.

15. An integrated circuit phase changeable memory device comprising:
    a lower conductive pattern disposed on an integrated circuit substrate;
    an insulating layer disposed on the substrate and having a contact hole exposing the lower conductive pattern;
    a carbon nano tube that extends from the lower conductive pattern in the contact hole, wherein a diameter of the carbon nano tube is smaller than a diameter of the contact hole;
    a supporting insulating layer in the contact hole between the carbon nano tube and the insulating layer;
    a phase changeable material pattern disposed on the supporting insulating layer and on the carbon nano tube in the contact hole, and on the insulating layer outside the contact hole; and
    an upper conductive pattern disposed on the phase changeable material pattern.

16. The device of claim 15, wherein the supporting insulating layer comprises a porous insulating layer.

* * * * *